United States Patent
Kirk

(10) Patent No.: US 7,910,456 B1
(45) Date of Patent: Mar. 22, 2011

(54) LIQUID BASED SUBSTRATE METHOD AND STRUCTURE FOR LAYER TRANSFER APPLICATIONS

(75) Inventor: Harry Robert Kirk, Campbell, CA (US)

(73) Assignee: Silicon Genesis Corporation, San Jose, CA (US)

( * ) Notice: Subject to any disclaimer, the term of this patent is extended or adjusted under 35 U.S.C. 154(b) by 970 days.

(21) Appl. No.: 11/807,188

(22) Filed: May 25, 2007

Related U.S. Application Data

(60) Provisional application No. 60/808,924, filed on May 26, 2006.

(51) Int. Cl.
*H01L 21/30* (2006.01)
*H01L 21/46* (2006.01)

(52) U.S. Cl. .............. 438/458; 438/459; 257/E21.568

(58) Field of Classification Search .............. 438/455, 438/458, 459; 257/E21.568
See application file for complete search history.

(56) References Cited

U.S. PATENT DOCUMENTS

| | | | |
|---|---|---|---|
| 7,351,644 B2 * | 4/2008 | Henley | 438/458 |
| 7,670,930 B2 * | 3/2010 | Tauzin et al. | 438/458 |
| 2003/0203547 A1 * | 10/2003 | Sakaguchi et al. | 438/151 |

OTHER PUBLICATIONS

B.N. Mukashev et al., *Hydrogen Implantation into Silicon: Infra-Red Absorption Spectra and Electrical Properties*, Institute of High Energy Physics, Academy of Sciences of the Kazakh SSR, Alma-Ata1; 91, 509 (1985).

* cited by examiner

*Primary Examiner* — Alexander G Ghyka
*Assistant Examiner* — Seahvosh J Nikmanesh
(74) *Attorney, Agent, or Firm* — Kilpatrick Townsend and Stockton LLP

(57) ABSTRACT

An embodiment of a composite substrate member in accordance with the present invention has a handle substrate member derived from a plurality of nanoparticles in a fluid mixture, and a thickness of material transferred to the handle substrate member. The handle substrate member may be formed from a plurality of liquid layers, for example a thinner surface layer conveying specific properties to the donor/substrate interface, and a thicker support layer dispensed over the surface layer.

19 Claims, 5 Drawing Sheets

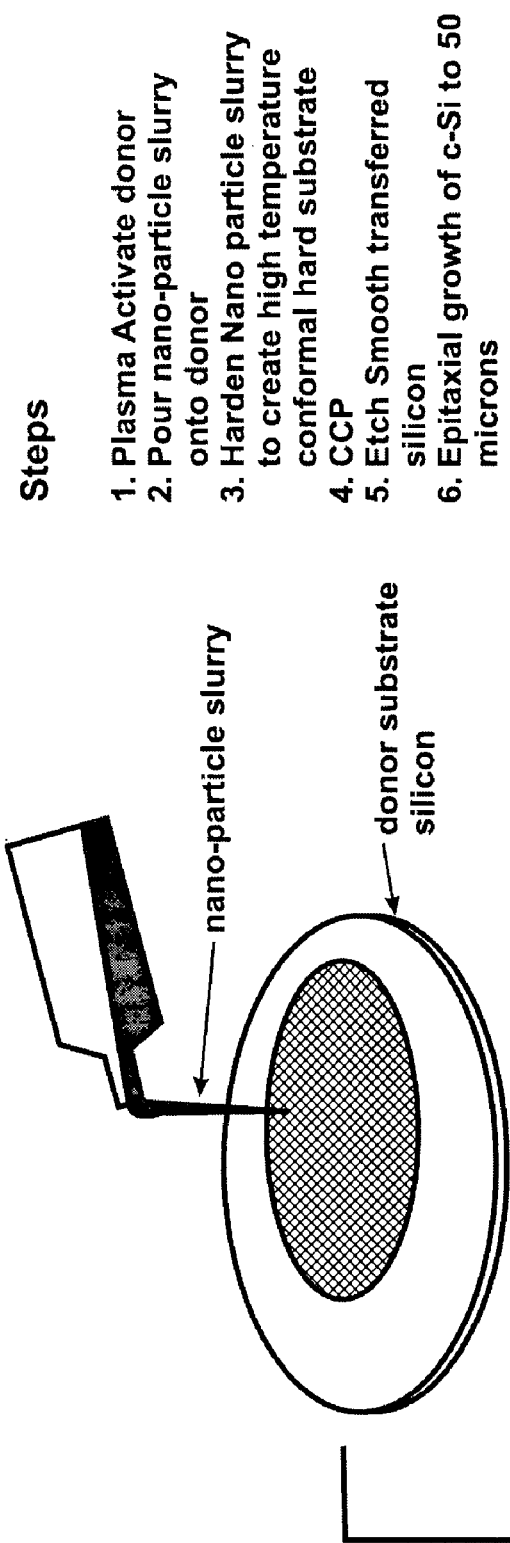
Steps
1. Plasma Activate donor
2. Pour nano-particle slurry onto donor
3. Harden Nano particle slurry to create high temperature conformal hard substrate
4. CCP
5. Etch Smooth transferred silicon
6. Epitaxial growth of c-Si to 50 microns
FIGURE 4
FIGURE 5
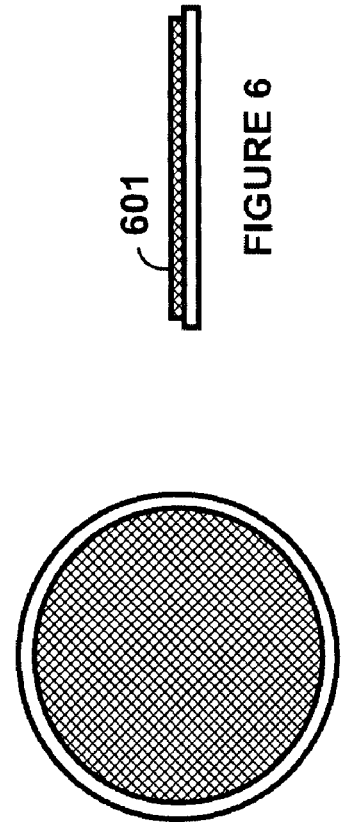
FIGURE 6

LIQUID BASED SUBSTRATE METHOD AND STRUCTURE FOR LAYER TRANSFER APPLICATIONS

CROSS-REFERENCE TO RELATED APPLICATION

The instant nonprovisional patent application claims priority to U.S. Provisional Patent Application No. 60/808,924, filed May 26, 2006 and incorporated by reference in its entirety herein for all purposes.

BACKGROUND OF THE INVENTION

The present invention relates to the manufacture of substrates. More particularly, the invention provides a technique including a method and a structure for forming multi-layered substrate structures using liquid based substrates for the fabrication of semiconductor integrated circuit devices. More particularly, the liquid based substrates are slurry based and will be used for layer transfer processes for solar cell members. But it will be recognized that the invention has a wider range of applicability; it can also be applied to other types of substrates for three-dimensional packaging of integrated semiconductor devices, photonic devices, piezoelectronic devices, flat panel displays, microelectromechanical systems ("MEMS"), nano-technology structures, sensors, actuators, solar cells, biological and biomedical devices, and the like.

From the beginning of time, human beings have relied upon the "sun" to derive almost all useful forms of energy. Such energy comes from petroleum, radiant, wood, and various forms of thermal energy. As merely an example, human being have relied heavily upon petroleum sources such as coal and gas for much of their needs. Unfortunately, such petroleum sources have become depleted and have lead to other problems. As a replacement, in part, solar energy has been proposed to reduce our reliance on petroleum sources. As merely an example, solar energy can be derived from "solar cells" commonly made of silicon.

The silicon solar cell generates electrical power when exposed to solar radiation from the sun. The radiation interacts with atoms of the silicon and forms electrons and holes that migrate to p-doped and n-doped regions in the silicon body and create voltage differentials and an electric current between the doped regions. Depending upon the application, solar cells have been integrated with concentrating elements to improve efficiency. As an example, solar radiation accumulates and focuses using concentrating elements that direct such radiation to one or more portions of active photovoltaic materials. Although effective, these solar cells still have many limitations.

As merely an example, solar cells rely upon starting materials such as silicon. Such silicon is often made using either polysilicon and/or single crystal silicon materials. These materials are often difficult to manufacture. Polysilicon cells are often formed by manufacturing polysilicon plates. Although these plates may be formed effectively, they do not possess optimum properties for highly effective solar cells. Single crystal silicon has suitable properties for high grade solar cells. Such single crystal silicon is, however, expensive and is also difficult to use for solar applications in an efficient and cost effective manner. Generally, thin-film solar cells are less expensive by using less silicon material but their amorphous or polycrystal structure are less efficient than the more expensive bulk silicon cells made from single-crystal silicon substrates. These and other limitations can be found throughout the present specification and more particularly below.

From the above, it is seen that a technique for manufacturing large substrates which is cost effective and efficient is desirable.

BRIEF SUMMARY OF THE INVENTION

According to the present invention, techniques related to the manufacture of substrates are provided. More particularly, the invention provides a technique including a method and a structure for forming multi-layered substrate structures using liquid based substrates for the fabrication of semiconductor integrated circuit devices. More particularly, the liquid based substrates are slurry based and will be used for layer transfer processes for solar cell members. But it will be recognized that the invention has a wider range of applicability; it can also be applied to other types of substrates for three-dimensional packaging of integrated semiconductor devices, photonic devices, piezoelectronic devices, flat panel displays, microelectromechanical systems ("MEMS"), nano-technology structures, sensors, actuators, solar cells, biological and biomedical devices, and the like.

In a specific embodiment, the present invention provides a composite substrate member. The member has a handle substrate member derived from a plurality of nanoparticles in a fluid mixture and a thickness of material transferred to the handle substrate member. The handle substrate member may be formed from a plurality of liquid layers, for example a thinner surface layer conveying specific properties to the donor/substrate interface, and a thicker support layer dispensed over the surface layer.

In an alternative specific embodiment, the present invention provides a method of forming a composite substrate member. In a specific embodiment, the present invention provides providing a donor substrate including a surface region, a cleave region within a depth from the surface region, and a thickness of material between the surface region and the cleave region. The method includes dispensing a fluid mixture comprising a plurality of nanoparticles overlying at least the surface region. The method also includes processing the fluid mixture comprising the plurality of nanoparticles to form a thickness of handle substrate material. The method includes removing the thickness of material from the donor substrate while maintaining attachment of the handle substrate material to the surface region of the thickness of material to form a cleaved surface region.

Numerous benefits are achieved over pre-existing techniques using the present invention. In particular, the present invention uses controlled energy and selected conditions to preferentially cleave a thin photovoltaic film onto a liquid (e.g., slurry) based substrate according to a specific embodiment. In a preferred embodiment, the present method and structure provide for single crystal silicon provided on a liquid based substrate for providing efficient power using photovoltaic cells. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIGS. 2 through 9 illustrate a simplified method for manufacturing integrated circuits on a layer transferred substrate according to embodiments of the present invention.

DETAILED DESCRIPTION OF THE INVENTION

According to the present invention, techniques related to the manufacture of substrates are provided. More particularly, the invention provides a technique including a method and a structure for forming multi-layered substrate structures using liquid based substrates for the fabrication of semiconductor integrated circuit devices. More particularly, the liquid based substrates are slurry based and will be used for layer transfer processes for solar cell members. But it will be recognized that the invention has a wider range of applicability; it can also be applied to other types of substrates for three-dimensional packaging of integrated semiconductor devices, photonic devices, piezoelectronic devices, flat panel displays, microelectromechanical systems ("MEMS"), nano-technology structures, sensors, actuators, solar cells, biological and biomedical devices, and the like.

Figure 1:
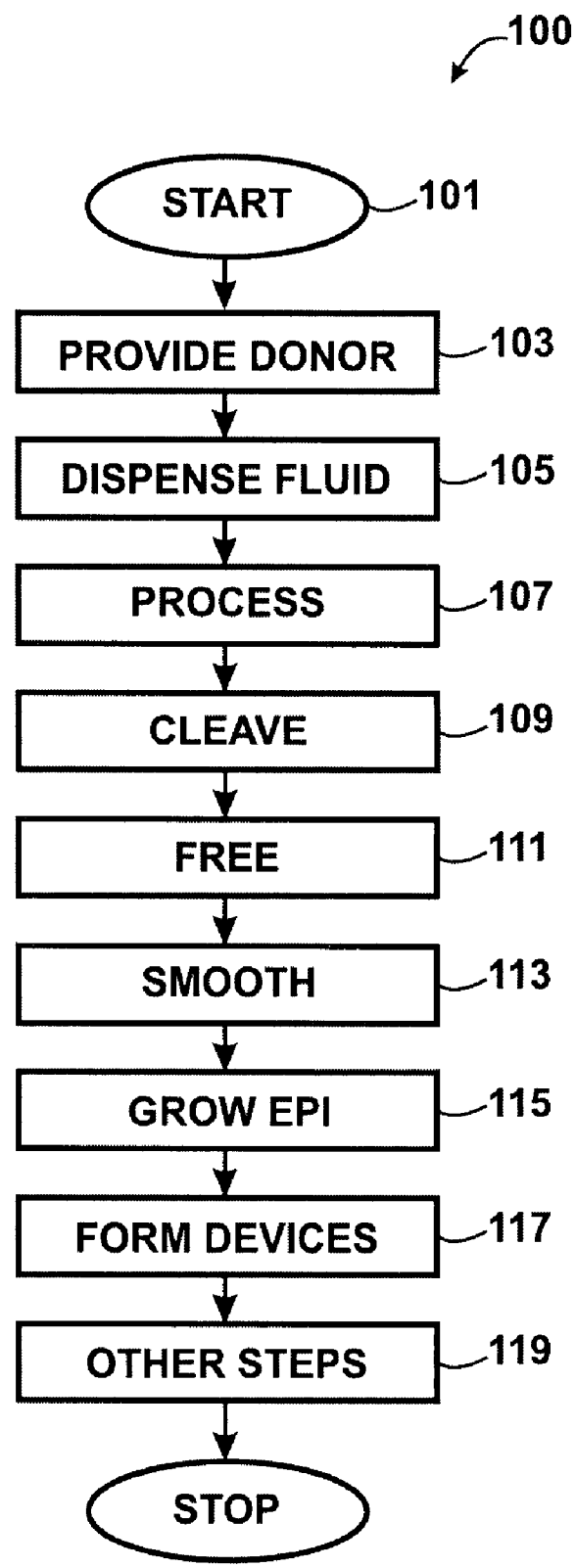
FIG. 1 illustrates an overall simplified method of using a fluid based substrate for layer transfer according to embodiments of the present invention.

Referring to FIG. 1, a method 100 for manufacturing substrates using a liquid based substrate member according to embodiments of the present invention may be outlined as follows:

1. Begin process at start, step 101;
2. Provide a donor substrate (step 103), which has a first surface region, a cleave region, and a thickness of material to be removed between the first surface region and the cleave region;
3. Dispense (step 105) a fluid including a plurality of nanoparticles overlying the first surface region of the donor substrate to form a thickness of fluid based material;
4. Process (step 107) the thickness of fluid based material to form a handle substrate member coupled to the first silicon substrate;
5. Perform a cleaving process (step 109) to remove the thickness of material, while the handle substrate remains attached to the thickness of material, to form a cleaved surface region;
6. Free (step 111) the remaining portion of the donor substrate from the handle substrate attached to the thickness of material;
7. Perform a smoothing process (step 113) on the cleaved surface region to form a second surface region;
8. Form an epitaxially grown layer (step 115) on the second surface to form a resulting thickness of material including the epitaxially grown layer;
9. Form one or more devices (step 117) on the resulting thickness of material; and
10. Perform other steps (step 119), as desired.

The above sequence of steps provides a method according to an embodiment of the present invention. As shown, the method uses a combination of steps including a way of forming a fluid based handle substrate member for layer transfer according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

Figure 2:
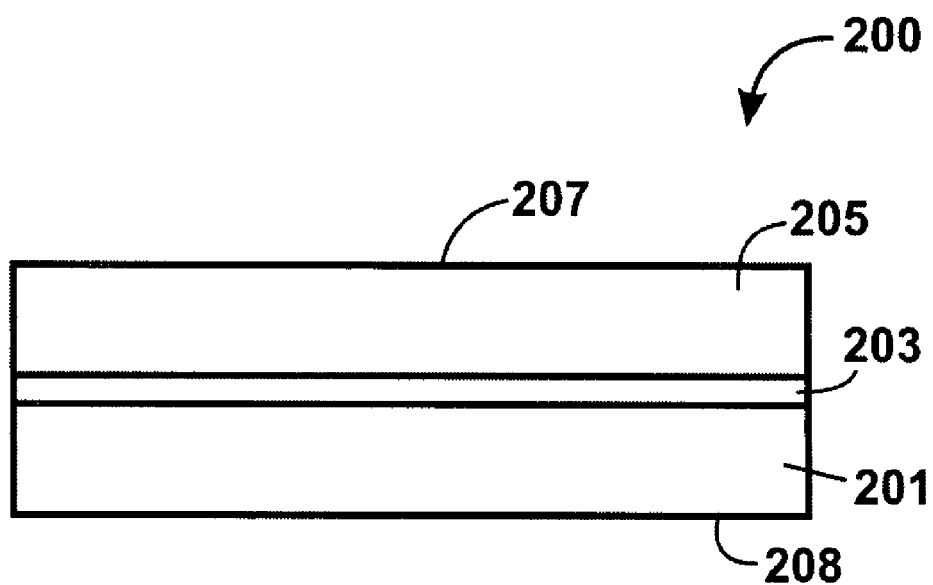

FIGS. 2 through 8 illustrate a simplified method for manufacturing integrated circuits on a layer transferred substrate according to embodiments of the present invention. These diagrams are merely examples, which should not unduly limit the scope of the claims herein. One of ordinary skill in the art would recognize other variations, modifications, and alternatives. As shown, the method includes providing a donor substrate 200 comprising a cleave region 203, a face 207, a backside 208, and a thickness of silicon bearing material 205 between the face and the cleave region, as shown in FIG. 2. As merely an example, the donor substrate can be a silicon wafer, a germanium wafer, silicon germanium materials, silicon carbide bearing materials, Group III/V compounds, any combination of these, and others. In a preferred embodiment, the donor substrate is made using a photosensitive material. Of course there can be other variations, modifications, and alternatives.

Depending upon the embodiment, the cleave region can be formed using a variety of techniques. That is, the cleave region can be formed using any suitable combination of implanted particles, deposited layers, diffused materials, patterned regions, and other techniques. Referring to FIG. 6, the method introduces certain energetic particles using an implant process through a top surface of a donor substrate to a selected depth, which defines a thickness of the material region, termed the "thin film" of material. A variety of techniques can be used to implant the energetic particles into the silicon wafer. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other non-mass specific techniques. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $1 \times 10e15$ to about $1 \times 10e18$ atoms/cm2, and preferably the dose is greater than about $1 \times 10e16$ atoms/cm2. Implantation energy ranges from about 1 KeV to about 1 MeV, and is generally about 50 KeV. Implantation temperature ranges from about 20 to about 600 Degrees Celsius, and is preferably less than about 400 Degrees Celsius to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. A resulting substrate, which has been subject to implant, is illustrated.

Depending upon the embodiment, there may be other techniques for forming a cleave region and/or cleave layer. As merely an example, such cleave region is formed using other processes, such as those called a Nanocleave™ process of Silicon Genesis Corporation of Santa Clara, Calif., a Smart-Cut™ process of Soitec SA of France, and an Eltran™ process of Canon Inc. of Tokyo, Japan, any like processes, and others. Of course, there may be other variations, modifications, and alternatives.

Optionally, the present method includes a cleaning process to clean the face and backside of the donor substrate. In a preferred embodiment, the face is cleaned using a plasma activated cleaning process. Such plasma activated processes clean and/or activate the surface of the substrate. The plasma activated processes are provided using an oxygen or a nitrogen bearing plasma at 20° C. to 40° C. temperature. The plasma activated processes are preferably carried out in dual frequency plasma activation system manufactured by Silicon Genesis Corporation of San Jose, Calif. Of course, there can be other variations, modifications, and alternatives, which have been described herein, as well as outside of the present specification.

Figure 3:
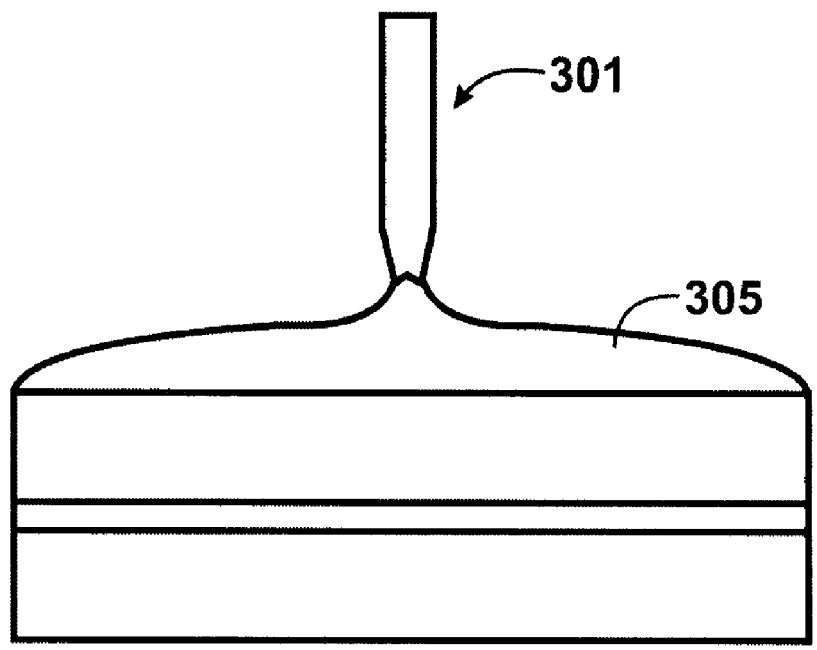

In a specific embodiment, the method includes dispensing 301 a fluid including a plurality of nanoparticles 305 overlying the face of the donor substrate, as shown in FIG. 3. The liquid substrate fluid mixture may comprise solvents and nano-particles which cure thermally by evaporating the solvent portion and bonding the nano particles together, as promoted by thermal treatments, e.g. heating. In a specific embodiment the nanoparticles can be from silicon dioxide, aluminum oxide species (e.g., Al2O3), other suitable materials, including combinations, and the like. While the specific embodiment just described utilizes a fluid including nanoparticles, other types of particles not limited to those having sizes in the nanometer ($1\times10^{-9}$ m) range may be utilized, including suspensions and other types of mixtures.

The fluid is dispensed overlying the face of the substrate, as further illustrated by FIG. 4. The fluid forms a thickness of material to cover the face, as shown in FIG. 5.

The thickness of material is subjected to a bake and/or cure treatment to evaporate volatile species and form a usable thickness of material 601, as illustrated by FIG. 6, which can serve as a handle substrate. The thermal heating to promote solvent evaporation and particle bonding and densification of any resulting solid phase porosity (i.e. reduction of porosity) may be referred to herein as a "liquid based substrate curing anneal."

This liquid based substrate curing anneal may be performed in a manner such that the total volume change occurring due to evaporation shrinkage, thermally induced volume changes of the nano particles, and porosity densification, is compensated to match the thermal and mechanical properties of the donor. For example, the liquid based substrate undergoing curing may expand at the same rate as the donor. Also, conditions (such as duration and temperature) of the liquid based substrate curing anneal may be matched to any engineered, thermal development of the cleave region within the donor wafer.

Of course, there can be other variations, modifications, and alternatives. Thus while FIGS. 3 and 4 show dispensing a single liquid to form a homogenous layer over the substrate, embodiments in accordance with the present invention are not limited to this approach.

In accordance with an alternative embodiment, the liquid based substrate may be comprised of a plurality of different layers of liquid, and each such liquid layer may have a different thickness. Such a liquid based substrate comprising different layers is hereafter referred to as a "multi-layer" liquid based substrate. Such different liquid layers may be present over the donor simultaneously (i.e. the layers may be immiscible with each other), or may be sequentially formed and cured, with the next succeeding liquid layer dispensed over the cured layer.

In accordance with certain embodiments, the various liquid layers may be tailored to achieve specific purposes. For example, the properties of the material in physical contact with the donor may be designed to affect the properties at the donor/substrate interface. In accordance with one embodiment, the layer at the donor interface may exhibit properties designed specifically to improve bonding strength to the donor. In accordance with another embodiment, the "multi-layer" liquid based substrate may have a layer in contact with the donor and exhibit properties designed specifically to improve local mechanical properties of the donor substrate interface, including but not limited to porosity, indentation hardness, indentation elastic modulus, Young's modulus, and other properties relating to properties on the donor wafer.

In accordance with other embodiments, the "multi-layer" liquid based substrate may include a layer in contact with the donor, which exhibits properties designed specifically to improve locally the electrical properties of the donor substrate interface. For example, a layer of the liquid substrate may include P-type or N-type dopants such as phosphorous, boron, or arsenic, whose presence can affect the conductivity of the material or form an electric field within the adjacent donor material by creating a pn junction to collect current or otherwise improve the solar collection efficiency of the assembly. The material may also be configured to have specific interactions with light, such as high reflectivity to enhance the overall photo/electric conversion efficiency of the assembly.

In certain of the embodiments of the multi-layer liquid based substrate just described, the layer conveying specific properties to the donor/substrate interface may be relatively thinner, with the properties of the remainder of the substrate material serving generally to provide mechanical strength to the assembly and may thus be relatively thicker. Use of such a thin liquid layer at the interface with the donor substrate may reduce cost, as the ingredients of the surface layer may be expensive and require special handling to prepare, as compared with the thicker underlying layer that is designed simply to provide mechanical support.

Still other embodiments in accordance with the present invention may utilize additional layers intervening between the donor contact layer and the mechanical support layer. These intervening layers may be designed to perform specific functions, such as making transitions between the surface and support layers, or to provide for multi-step curing, i.e. building up the substrate in layers.

Figure 7:
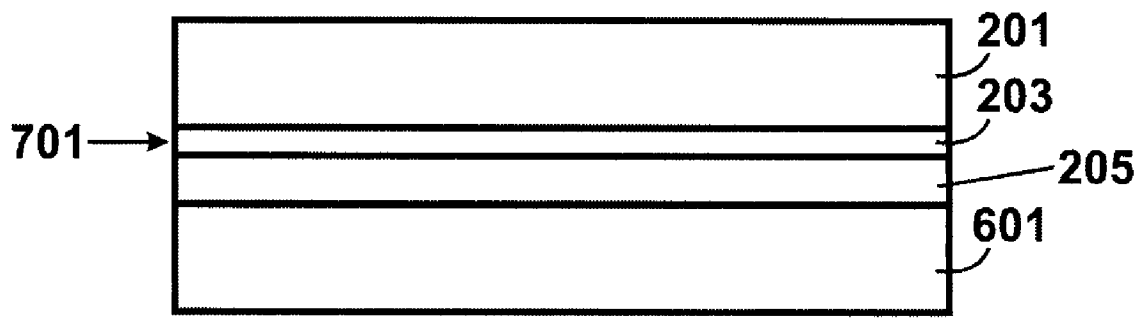
Figure 8:
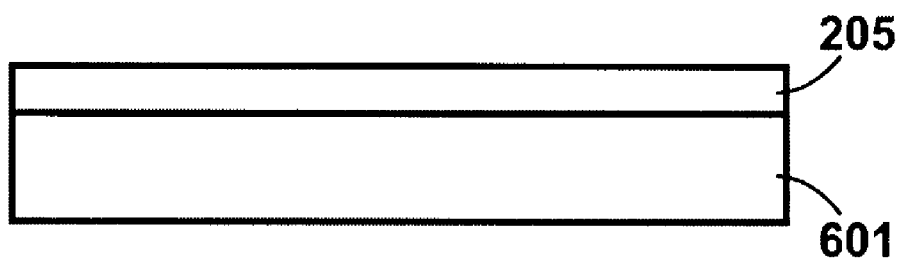

In a specific embodiment, the method performs a controlled cleaving process 701 on the multilayered substrate structure, as illustrated by FIGS. 7 and 8. The controlled cleaving process provided a selected energy within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. Next, the method frees the thickness of material from the donor substrate to completely remove the thickness of material from the donor substrate, as shown by FIG. 8.

Optionally, the method can use a backing substrate to provide support to the handle substrate. In a specific embodiment, the method removes the backing substrate from the handle substrate after cleaving the thickness of material. In a preferred embodiment, the attachment between the backing substrate and handle substrate is temporary and can be removed with mechanical force without damaging either substrates. In a specific embodiment, a separation process may be used to detaching the backing substrate from the handle substrate. In a specific embodiment, the backing substrate can also be released when the backing substrate member has been provided using an electrostatic, vacuum, or mechanical chuck and/or attachment device. Of course, there can be other variations, modifications, and alternatives.

Figure 9:
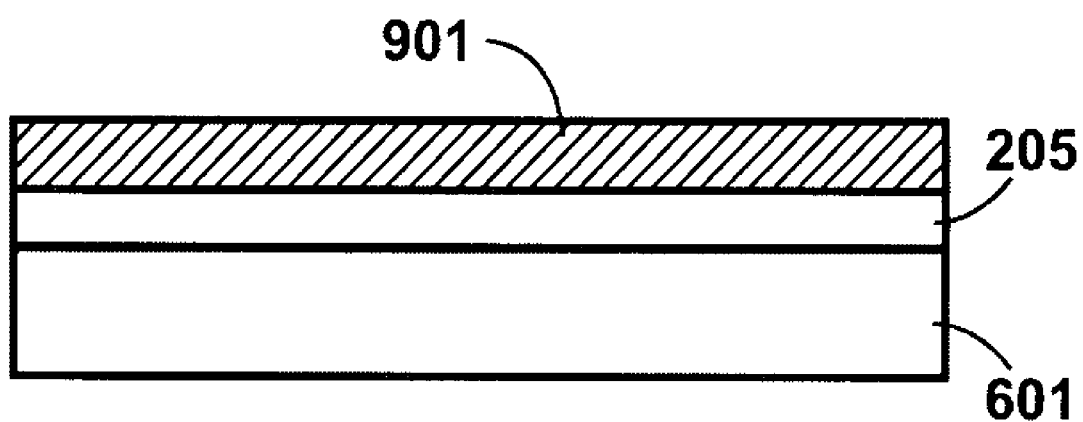

Referring to FIG. 9, the method forms photovoltaic devices 901 onto surfaces of the thickness of material. Such devices can also include integrated semiconductor devices and photovoltaic devices. Such devices can be made using deposition, etching, implantation, photo masking processes, ink jet printing, screen printing, any combination of these, and the like. Of course, there can be other variations, modifications, and alternatives.

In a specific embodiment, the method can also thicken the thickness of transferred material using a deposition process. In a specific embodiment, the method uses a solid phase epitaxial process and/or other forms of deposition processes. The process can form a suitable single crystal silicon or like material according to a specific embodiment. As merely an example, the material can be amorphous silicon, polycrystalline silicon, germanium and silicon germanium alloy. For example, amorphous silicon could advantageously allow for solid-phase epitaxial growth of single-crystal silicon using the underlying transferred silicon film as a template.

Another method that can increase the effective rate of silicon material deposition is to spray or coat the surface with silicon nanoparticles (advantageously amorphous silicon) which can be thermally treated to produce single-crystal silicon using the underlying transferred silicon film as a template. This can be applied dry of using a liquid that would be eliminated during subsequent processing. Polycrystalline silicon and other materials may also allow single-crystal regrowth using appropriate treatments such as laser anneals, flash thermal treatments and the like. Of course, there can be other variations, modifications, and alternatives.

In a specific embodiment, the present method includes an etching and/or deposition process (e.g., plasma assisted deposition) for smoothing the cleaved surface region before any step of forming photovoltaic regions and/or forming the thickened layer. The method can use a smoothing process that includes thermal treatment of the cleaved film using a hydrogen and hydrogen chloride containing environment according to a specific embodiment. Alternatively, the etchant can be a chemical bath (e.g., KOH, TMAH) to etch the cleaved film to a predetermined amount. The etching process can be used to remove about 300 to about 800 Angstroms of hydrogen damaged silicon, as an example. In a specific embodiment, the etching process can also be preceded by an oxidation process to convert the hydrogen damaged region into oxide, which is later stripped using a buffered oxide etch and/or other suitable etching species. Of course, there can be other variations, modifications, and alternatives.

In a preferred embodiment, the transferred material is thickened using an amorphous silicon layer. In a preferred embodiment, the amorphous silicon layer is recrystallized or the like. In a specific embodiment, the amorphous silicon layer is deposited using application of nanoparticles (e.g., amorphous silicon, crystalline silicon, polysilicon, or combinations of these), which are later subjected to a thermal treatment to cause formation of a sheet of thickened material. Alternatively, the amorphous silicon layer can be formed using physical vapor deposition or chemical vapor deposition (e.g., plasma enhanced) at low temperature according to a specific embodiment. In a preferred embodiment, the amorphous silicon layer, which has been deposited overlying a glass material, is maintained at a temperature of less than 500 Degrees Celsius during formation of such silicon layer. In a specific embodiment, the resulting film can be a single crystal and/or polycrystalline structure according to a specific embodiment. In preferred embodiments, the resulting film is single crystalline and has suitable electrical characteristics. Of course, there can be other variations, modifications, and alternatives.

Depending upon the embodiment, the thickened material can be subjected to impurities to form the solar cell structures. In a specific embodiment, the impurities can be in-situ doped, diffused, and/or implanted using ion beams, plasma immersion implantation, ion shower, non-mass separated implantation, substantially or partially non-mass separated, or conventional implantation techniques. These solar cell structures can include impurity regions for P-type and N-type impurities according to a specific embodiment. Of course, there can be other variations, modifications, and alternatives.

In a specific embodiment, the method can also form another layer overlying the thickened layer to form the photovoltaic devices. The other layer can be a semiconductor layer, which can be used to enhance the photovoltaic devices provided for the completed solar cell structure, according to a specific embodiment. In an alternative embodiment, the other layer can be germanium, silicon germanium, II/IV, III/V, any combination of these, and others. The other layer can be used to form another set of photovoltaic regions, which can be coupled to other photovoltaic devices, to enhance the total photovoltaic intensity. Of course, there can be other variations, modifications, and alternatives.

Depending upon the embodiment, the present method and structure can be formed with a specific thickness of the thickened layer and/or combination of the layer transferred layer and thickened layer. In a specific embodiment, the thickened layer can be about 1 micron and 20 microns using a silicon material. In other embodiments, the thickened layer can be less than 1 micron or greater than 20 microns. In other embodiments, the thickened layer can be less than about 50 microns. Of course, there can be other variations, modifications, and alternatives.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions to allow for formation of the cleave plane with a modified dose and/or cleaving properties according to alternative embodiments. In certain embodiments, the backing substrate can be applied to each of the substrates, including handle and donor. In alternative embodiments. coatings may also be provided on surfaces or other regions of a transparent material, which may begin as the fluid and nanoparticles. Therefore, the above description and illustrations should not be taken as limiting the scope of the present invention which is defined by the appended claims.

What is claimed is:

1. A method of forming a composite substrate member, the method comprising:
   providing a donor substrate including a surface region, a cleave region within a depth from the surface region, and a thickness of material between the surface region and the cleave region;
   dispensing a fluid mixture comprising a plurality of particles overlying at least the surface region;
   processing the fluid mixture comprising the plurality of particles to form a thickness of handle substrate material; and
   removing the thickness of material from the donor substrate while maintaining attachment of the handle substrate material to the surface region of the thickness of material to form a cleaved surface region.

2. The method of claim 1 further comprising smoothing the cleaved surface region.

3. The method of claim 1 further comprising forming an epitaixial material overlying the thickness of material while maintaining attachment of the handle substrate to the thickness of material.

4. The method of claim 1 wherein the donor substrate comprises a silicon substrate material.

5. The method of claim 1 wherein the donor substrate is a single crystal silicon material.

6. The method of claim 1 wherein the dispensing comprises applying the fluid mixture using a spin coating process.

7. The method of claim 1 wherein the fluid mixture comprise a solvent and the plurality of particles.

8. The method of claim 1 wherein the thickness of the handle substrate is at least one millimeters.

9. The method of claim 1 wherein the processing comprises evaporating a solvent from the fluid mixture.

10. The method of claim 1 wherein the processing comprises baking the fluid mixture to remove any solvent therefrom.

11. The method of claim 1 wherein the plurality of particles comprise silicon dioxide.

12. The method of claim 1 wherein the plurality of particles comprise aluminum oxide species.

13. The method of claim 1 wherein the plurality of particles comprises nanoparticles.

14. The method of claim 1 wherein dispensing the fluid mixture comprises dispensing a first liquid layer followed by a second liquid layer.

15. The method of claim 14 wherein the first liquid layer is designed to cause a donor/substrate interface to exhibit a specific property.

16. The method of claim 15 wherein the property is electrical conductivity, porosity, indentation hardness, indentation elastic modulus, Young's modulus, or bonding strength.

17. The method of claim 14 wherein the second liquid layer is designed to provide mechanical support.

18. The method of claim 14 wherein dispensing the fluid mixture comprises dispensing a third liquid layer over the second liquid layer.

19. The method of claim 1 wherein thermal or mechanical properties of the fluid mixture are compensated to match the thermal and mechanical properties of the donor during processing.

* * * * *